(12) United States Patent
Mori et al.

(10) Patent No.: US 11,946,133 B2
(45) Date of Patent: Apr. 2, 2024

(54) GLASS ROLL PRODUCTION METHOD

(71) Applicant: Nippon Electric Glass Co., Ltd., Shiga (JP)

(72) Inventors: Hiroki Mori, Shiga (JP); Takayoshi Saito, Shiga (JP); Naotoshi Inayama, Shiga (JP); Riku Yamashiro, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 384 days.

(21) Appl. No.: 17/612,733

(22) PCT Filed: May 22, 2020

(86) PCT No.: PCT/JP2020/020395
§ 371 (c)(1),
(2) Date: Nov. 19, 2021

(87) PCT Pub. No.: WO2020/250646
PCT Pub. Date: Dec. 17, 2020

(65) Prior Publication Data
US 2022/0235452 A1    Jul. 28, 2022

(30) Foreign Application Priority Data

Jun. 11, 2019  (JP) .................................. 2019-108654

(51) Int. Cl.
*B65H 20/02*     (2006.01)
*B65H 23/18*     (2006.01)
(Continued)

(52) U.S. Cl.
CPC ........... *C23C 14/562* (2013.01); *B65H 20/02* (2013.01); *B65H 23/18* (2013.01); *C03C 17/245* (2013.01);
(Continued)

(58) Field of Classification Search
CPC ........................... B65H 20/00; B65H 2301/20
See application file for complete search history.

(56) References Cited

U.S. PATENT DOCUMENTS

2014/0154424 A1* 6/2014 Oh .......................... C23C 14/34
427/523
2014/0377461 A1   12/2014 Saitoh
(Continued)

FOREIGN PATENT DOCUMENTS

| JP | 2013-124413 | 6/2013 |
|----|-------------|--------|
| JP | 2014-051429 | 3/2014 |

(Continued)

OTHER PUBLICATIONS

International Preliminary Report on Patentability and Written Opinion of the International Searching Authority dated Dec. 14, 2021 in International (PCT) Application No. PCT/JP2020/020395.
International Search Report dated Jul. 14, 2020 in International (PCT) Application No. PCT/JP2020/020395.

*Primary Examiner* — Austin Murata
(74) *Attorney, Agent, or Firm* — Wenderoth, Lind & Ponack, L.L.P.

(57) ABSTRACT

A production method for a glass roll includes a start preparation step (S1) of feeding-out a first lead film (LF1) coupled to a starting end portion (GFa) of a first glass film (GF1) from an unwinding device (3) and allowing a winding device (8) to wind the first lead film (LF1 after passing of the first lead film (LF1) through a thermal film-forming device (4),). The start preparation step (S1) includes a temperature increasing step of causing the thermal film-forming device (4) to be increased in temperature to a film-forming temperature. The first glass film (GF1) reaches the thermal film-forming device (4) before the thermal film-forming device (4) is increased in temperature to the film-forming temperature.

20 Claims, 7 Drawing Sheets

(51) Int. Cl.

| | | |
|---|---|---|
| | *C03C 17/245* | (2006.01) |
| | *C03C 17/32* | (2006.01) |
| | *C23C 14/02* | (2006.01) |
| | *C23C 14/34* | (2006.01) |
| | *C23C 14/56* | (2006.01) |
| | *C23C 14/08* | (2006.01) |

(52) U.S. Cl.
CPC .............. *C03C 17/32* (2013.01); *C23C 14/02* (2013.01); *C23C 14/34* (2013.01); *B65H 2301/522* (2013.01); *C03C 2217/948* (2013.01); *C03C 2218/154* (2013.01); *C03C 2218/30* (2013.01); *C23C 14/086* (2013.01)

(56) References Cited

U.S. PATENT DOCUMENTS

| | | |
|---|---|---|
| 2015/0165749 A1 | 6/2015 | Tamagaki |
| 2016/0016746 A1* | 1/2016 | Teranishi ................ B32B 17/10 242/532.1 |
| 2016/0276631 A1* | 9/2016 | Yamazaki ............... B32B 37/06 |
| 2020/0283334 A1 | 9/2020 | Hasegawa et al. |

FOREIGN PATENT DOCUMENTS

| | | |
|---|---|---|
| JP | 2014-109073 | 6/2014 |
| JP | 2016-041630 | 3/2016 |
| JP | 2017-109850 | 6/2017 |
| JP | 2018-188320 | 11/2018 |
| WO | 2012/090693 | 7/2012 |
| WO | 2019/102836 | 5/2019 |

\* cited by examiner

GLASS ROLL PRODUCTION METHOD

TECHNICAL FIELD

The present invention relates to a method of producing a glass roll by winding a glass film having a functional film formed thereon.

BACKGROUND ART

Hitherto, there has been known a technology of forming a functional film on a glass film by a roll-to-roll method while drawing out the glass film from a base glass roll and conveying the glass film in a predetermined direction.

For example, in Patent Literature 1, there is disclosed a production method for a glass roll, including: a glass film supplying step of drawing out a first glass film from a base glass roll and feeding-out the first glass film in a predetermined direction; a film-forming step of forming a second glass film through thermal film formation of a functional film (transparent conductive film) on the first glass film; a protective film supplying step of forming a third glass film by superposing a protective film on the second glass film; and a winding step of winding the third glass film into a roll shape to form a glass roll.

In the case of winding the glass film (third glass film) having the functional film formed thereon into the roll shape as described above, it is required that the glass film be coupled to a winding core. For example, in Patent Literature 2, there is disclosed a technology of coupling a winding core and a glass film to each other with a lead film (leader) made of a resin in order to prevent breakage of the glass film.

CITATION LIST

Patent Literature 1: JP 2018-188320 A
Patent Literature 2: JP 2017-109850 A

SUMMARY OF INVENTION

Technical Problem

In the case of forming the functional film on the glass film by the roll-to-roll method as in the related art, the lead film made of a resin is lower in thermal resistance than the glass film. Thus, there is a risk in that the lead film is broken by heat transferred from a film-forming device when the lead film passes through the film-forming step.

The present invention has been made in view of the circumstances described above, and has a technical object to perform thermal film formation on a glass film without causing breakage of a lead film.

Solution to Problem

In order to solve the above-mentioned problem, according to the present invention, there is provided a production method for a glass roll, in which a functional film is formed with a thermal film-forming device on a first glass film fed-out from an unwinding device to form a second glass film and the second glass film is wound by a winding device, the production method comprising: a start preparation step of feeding-out a first lead film coupled to a starting end portion of the first glass film from the unwinding device and allowing the winding device to wind the first lead film after passing of the first lead film through the thermal film-forming device; and a film-forming step of forming a functional film on the first glass film with the thermal film-forming device after the passing of the first lead film through the thermal film-forming device, wherein the start preparation step comprises a temperature increasing step of causing the thermal film-forming device to be increased in temperature to a film-forming temperature, and wherein, before the thermal film-forming device is increased in temperature to the film-forming temperature, the first glass film reaches the thermal film-forming device.

According to the configuration described above, before the thermal film-forming device reaches the film-forming temperature, the first lead film coupled to the first glass film can pass through the thermal film-forming device. Accordingly, the thermal film formation on the first glass film can be performed without causing breakage of the first lead film. The expression "before the heating device is increased in temperature to the film-forming temperature" includes not only after the start of the temperature increasing step but also before the start of the temperature increasing step.

The temperature increasing step may be started after a coupling portion between the first glass film and the first lead film passes through the thermal film-forming device. When the temperature increasing step is started after the first lead film entirely passes through the thermal film-forming device, the breakage of the first lead film due to the film-forming step can reliably be prevented.

In the production method for a glass roll according to the present invention, while the thermal film-forming device is increased in temperature in the temperature increasing step, the first glass film may reach the thermal film-forming device.

The production method for a glass roll of the present invention may further comprise a termination preparation step of feeding-out a second lead film coupled to a terminating end portion of the first glass film from the unwinding device, allowing the second lead film to pass through the thermal film-forming device, and allowing the winding device to wind the second lead film, the termination preparation step may comprise a temperature decreasing step of causing the thermal film-forming device to be decreased in temperature, and the temperature decreasing step maybe started before the terminating end portion of the first glass film reaches the thermal film-forming device.

According to the configuration described above, when the temperature decreasing step is started while the first glass film passes through the thermal film-forming device, before the second lead film reaches the thermal film-forming device, the temperature of the thermal film-forming device can be decreased to such a temperature that the second lead film is prevented from being broken.

In the production method for a glass roll according to the present invention, the thermal film-forming device may comprise a heating roller configured to convey the first glass film while heating the first glass film in contact, and a conveyance speed of the first glass film in the start preparation step may be set to be lower than a conveyance speed of the first glass film in the film-forming step.

According to the configuration described above, when the conveyance speed in the start preparation step is set to be lower than the conveyance speed in the film-forming step, the amount of the first glass film to be conveyed without being subjected to film formation in the start preparation step can be reduced as much as possible.

In the production method for a glass roll according to the present invention, a conveyance speed of the first glass film in the termination preparation step may be set to be lower than a conveyance speed of the first glass film in the film-forming step.

According to the configuration described above, when the conveyance speed in the termination preparation step is set to be lower than the conveyance speed in the film-forming step, the amount of the first glass film to be conveyed without being subjected to film formation in the termination preparation step can be reduced as much as possible.

In the production method for a glass roll according to the present invention, a conveyance speed of the first glass film in the termination preparation step may be set to be lower than a conveyance speed of the first glass film in the start preparation step.

The time required for the temperature decreasing step of the termination preparation step is longer than the time required for the temperature increasing step of the start preparation step. Thus, when the conveyance speed for the termination preparation step is set to be lower than the conveyance speed for the start preparation step, a longer time can be secured for allowing the second lead film to reach the thermal film-forming device.

In the production method for a glass roll according to the present invention, in the temperature increasing step, after the first glass film reaches the thermal film-forming device, the first glass film may be caused to reciprocally move between the unwinding device and the winding device. With this configuration, the amount of the first glass film to be conveyed without being subjected to film formation in the start preparation step can be reduced as much as possible.

Advantageous Effects of Invention

According to the present invention, thermal film formation on the glass film can be performed without causing breakage of the lead film.

DESCRIPTION OF EMBODIMENTS

Now, embodiments of the present invention are described with reference to the drawings. FIG. 1 to FIG. 5 show a production method for a glass roll according to a first embodiment of the present invention.

A production apparatus used for the production method employs a roll-to-roll method, and is configured to produce a glass roll by forming a functional film on a transparent glass film which is drawn out from a base glass roll and winding the glass film into a roll shape. The glass film drawn out from the base glass roll is hereinafter referred to as "first glass film," and the glass film having the functional film formed thereon is hereinafter referred to as "second glass film."

Figure 1:
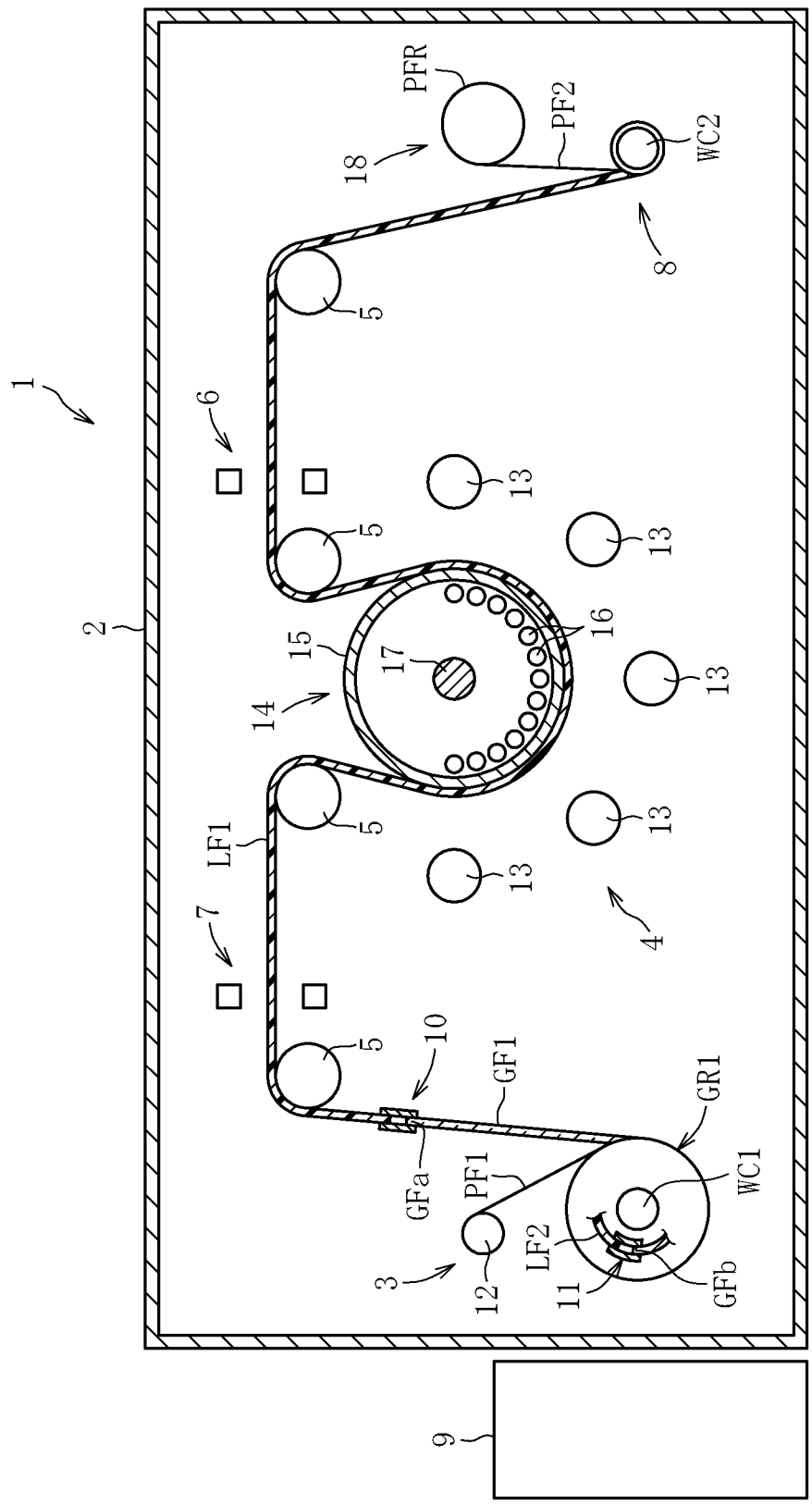
FIG. 1 is a sectional view for illustrating a production apparatus for a glass roll according to a first embodiment.

As illustrated in FIG. 1, a production apparatus 1 comprises a vacuum chamber 2, an unwinding device 3, a film-forming device 4, guide rollers 5, sensors 6 and 7, a winding device 8, and a control device 9.

The vacuum chamber 2 accommodates the unwinding device 3, the film-forming device 4, the guide rollers 5, the sensors 6 and 7, and the winding device 8. An internal space of the vacuum chamber 2 is set to a predetermined degree of vacuum by a vacuum pump. An inactive gas such as argon gas may be supplied into the vacuum chamber 2.

The unwinding device 3 rotatably supports a base glass roll GR1. Further, the unwinding device 3 draws out a first glass film GF1 from the base glass roll GR1 and delivers the first glass film GF1 to the film-forming device 4. The unwinding device 3 can change the rotation speed of the base glass roll GR1 (delivery speed of the first glass film GF1) through control by the control device 9.

The base glass roll GR1 mounted to the unwinding device 3 comprises the first glass film GF1, a first lead film LF1, a second lead film LF2, a protective film PF1, and a winding core WC1. The first lead film LF1 is coupled to a starting end portion GFa of the first glass film GF1. The second lead film LF2 is coupled to a terminating end portion GFb of the first glass film GF1. The protective film PF1 is superposed on the first glass film GF1.

The first glass film GF1 and each of the lead films LF1 and LF2 are coupled to each other by an adhesive tape or other coupling member. A coupling portion between the starting end portion GFa of the first glass film GF1 and the first lead film LF1 is hereinafter referred to as "first coupling portion 10," and a coupling portion between the terminating end portion GFb of the first glass film GF1 and the second lead film LF2 is hereinafter referred to as "second coupling portion 11." The second lead film LF2 has one end portion (starting end portion) coupled to the terminating end portion GFb of the first glass film GF1 via the second coupling portion 11 and another end portion (terminating end portion) coupled to the winding core WC1.

The first glass film GF1 has a thickness of equal to or smaller than 500 µm, preferably equal to or larger than 10 µm and equal to or smaller than 300 µm, most preferably equal to or larger than 30 µm and equal to or smaller than 200 µm.

As a material of the first glass film GF1, a silicate glass or a silica glass is used, borosilicate glass, a soda lime glass, an aluminosilicate glass, or a chemically tempered glass is preferably used, and an alkali-free glass is most preferably used. Here, the alkali-free glass is a glass which does not substantially contain an alkaline component (alkali metal oxide), specifically, a glass in which a weight ratio of the alkaline component is equal to or smaller than 3,000 ppm. The weight ratio of the alkaline component in the present invention is preferably equal to or smaller than 1,000 ppm, more preferably equal to or smaller than 500 ppm, most preferably equal to or smaller than 300 ppm.

A film made of a resin is used for each of the lead films LF1 and LF2. Specifically, as a material for the lead films LF1 and LF2, for example, an organic resin film (synthetic resin film), such as a polyethylene-telephthalate film, an ionomer film, a polyethylene film, a polypropylene film, a polyvinyl chloride film, a polyvinylidene chloride film, a polyvinyl alcohol film, a polyester film, a polycarbonate film, a polystyrene film, a polyacrylonitrile film, an ethylene-vinyl acetate copolymer film, an ethylene-vinyl alcohol copolymer film, an ethylene-methacrylic acid copolymer film, a nylon (trademark) film (polyamide film), a polyimide film, or cellophane, may be used.

The unwinding device 3 comprises a protective-film collecting unit 12 configured to wind the protective film PF1 included in the base glass roll GR1. The protective-film collecting unit 12 is arranged at a position above the unwinding device 3, but is not limited to this position. The protective-film collecting unit 12 collects the protective film PF1 by separating the protective film PF1 superposed on the first glass film GF1 and winding the protective film PF1 into a roll shape.

The film-forming device 4 is formed of a thermal film-forming device, which is configured to convey the first glass film GF1 while heating and form the functional film on the first glass film GF1. The film-forming device 4 is capable of forming the functional film on the first glass film GF1 by various film-forming methods such as a sputtering method, a vapor deposition method, and a CVD method. In this embodiment, description is made of a case in which a transparent conductive film, for example, an ITO film being the functional film is formed by the sputtering method.

The film-forming device 4 is formed of, for example, an ion-beam sputtering device or a magnetron sputtering device. The film-forming device 4 being the sputtering device mainly comprises a plurality of sputter sources 13 and a heating unit 14. The sputter sources 13 each include a target. The heating unit 14 is configured to heat the first glass film GF1.

The sputter sources 13 are arranged apart from the heating unit 14 by a certain distance so as to allow sputter particles (ITO particles) dispersed from the targets to adhere to one surface of the first glass film GF1.

The heating unit 14 is formed of a rotatable heating roller (can roller) which is configured to heat the first glass film GF1 while being in contact with the first glass film GF1. The heating unit 14 comprises a roller main body 15 and heaters 16. The roller main body 15 has a cylindrical shape and supports the first glass film GF1. The heaters 16 are configured to heat the roller main body 15.

The roller main body 15 is made of glass, ceramics, or metal. The roller main body 15 is rotatably supported by a shaft portion 17.

The heaters 16 are arranged on an inner side of the roller main body 15 so as to heat the roller main body 15. The heaters 16 are each formed of, for example, an infrared heater or a near-infrared heater, but are not limited to those heaters.

The plurality of guide rollers 5 are driven to rotate by a motor (not shown), but some of the guide rollers 5 may be formed of a free roller. The guide rollers 5 are arranged at intervals between the unwinding device 3 and the film-forming device 4 and between the film-forming device 4 and the winding device 8.

The sensors 6 and 7 comprise a first sensor 6 and a second sensor 7. The first sensor 6 is arranged on a downstream side of the film-forming device 4 (between the film-forming device 4 and the winding device 8). The second sensor 7 is arranged on an upstream side of the film-forming device 4 (between the unwinding device 3 and the film-forming device 4). The sensors 6 and 7 are each formed of, for example, a non-contact sensor such as a transmission laser sensor, but are not limited to this configuration.

The first sensor 6 detects the first coupling portion 10 and the starting end portion GFa of the first glass film GF1 and transmits a detection signal to the control device 9. The second sensor 7 detects the second coupling portion 11 and the terminating end portion GFb of the first glass film GF1 and transmits a detection signal to the control device 9.

The winding device 8 superposes a protective film PF2 on the second glass film and winds the second glass film around a winding core WC2 to form a glass roll. The winding device 8 can change the rotation speed of the winding core WC2 through control by the control device 9.

The winding device 8 comprises a protective film supplying unit 18 configured to supply the protective film PF2 to the second glass film that is to be wound around the winding core WC2. The protective film supplying unit 18 is arranged at a position above the winding device 8, but is not limited to this position. The protective film supplying unit 18 comprises a protective film roll PFR and is configured to supply the protective film PF2, which is drawn out from the protective film roll PFR, to the second glass film.

The control device 9 comprises a computer (for example, PC) having various kinds of hardware mounted thereto, such as a CPU, a ROM, a RAM, a HDD, an input/output interface, and a display. The control device 9 is communicably connected to the unwinding device 3, the guide rollers 5, the film-forming device 4, and the winding device 8, and is configured to execute, for example, control of the unwinding device 3, rotation control of the guide rollers 5, control related to heating, film formation, and conveyance of the film-forming device 4, and control of the winding device 8.

Figure 2:
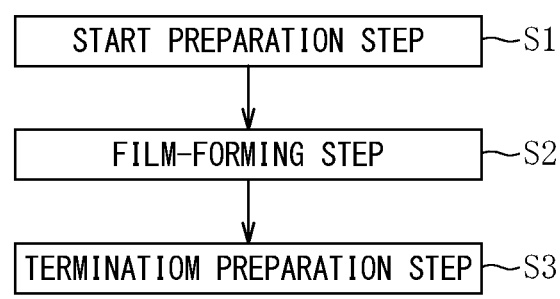
FIG. 2 is a flow chart for illustrating a production method for a glass roll.

Now, description is made of a method of producing a glass roll with use of the production apparatus 1 having the configuration described above. As illustrated in FIG. 2, the method comprises a start preparation step S1, a film-forming step S2, and a termination preparation step S3.

In the start preparation step S1, the base glass roll GR1 is mounted to the unwinding device 3. The first lead film LF1 is drawn out from the base glass roll GR1, and a starting end portion of the first lead film LF1 is coupled to the winding core WC2 of the winding device 8. After that, the vacuum chamber 2 is closed, and the internal space of the vacuum chamber 2 is set to a predetermined degree of vacuum. Further, the vacuum chamber 2 is filled with the inactive gas.

Next, the control device 9 causes the unwinding device 3, the guide rollers 5, the roller main body 15 of the heating unit 14, and the winding device 8 to operate in synchronization with each other to convey the first lead film LF1 at a predetermined speed from the unwinding device 3 on the upstream side to the winding device 8 on the downstream side. It is preferred that the conveyance speed of the first lead film LF1 in this case be constant within a range of from 0.01 m/min to 0.5 m/min, but the conveyance speed is not limited to this range. The first lead film LF1 passes through the film-forming device 4 and is wound by the winding device 8.

In the start preparation step S1, the first lead film LF1 having passed through the film-forming device 4 is wound by the winding device 8 so that the first glass film GF1 included in the base glass roll GR1 is drawn out from the base glass roll GR1. The first glass film GF1 is conveyed together with the first lead film LF1 via the film-forming device 4 to the winding device 8. At this time, the first glass film GF1 is conveyed at the same speed as the conveyance speed of the first lead film LF1. The conveyance speed of the first glass film GF1 in the start preparation step S1 is set to be lower than a conveyance speed of the first glass film GF1 in the film-forming step S2 described later.

Figure 3:
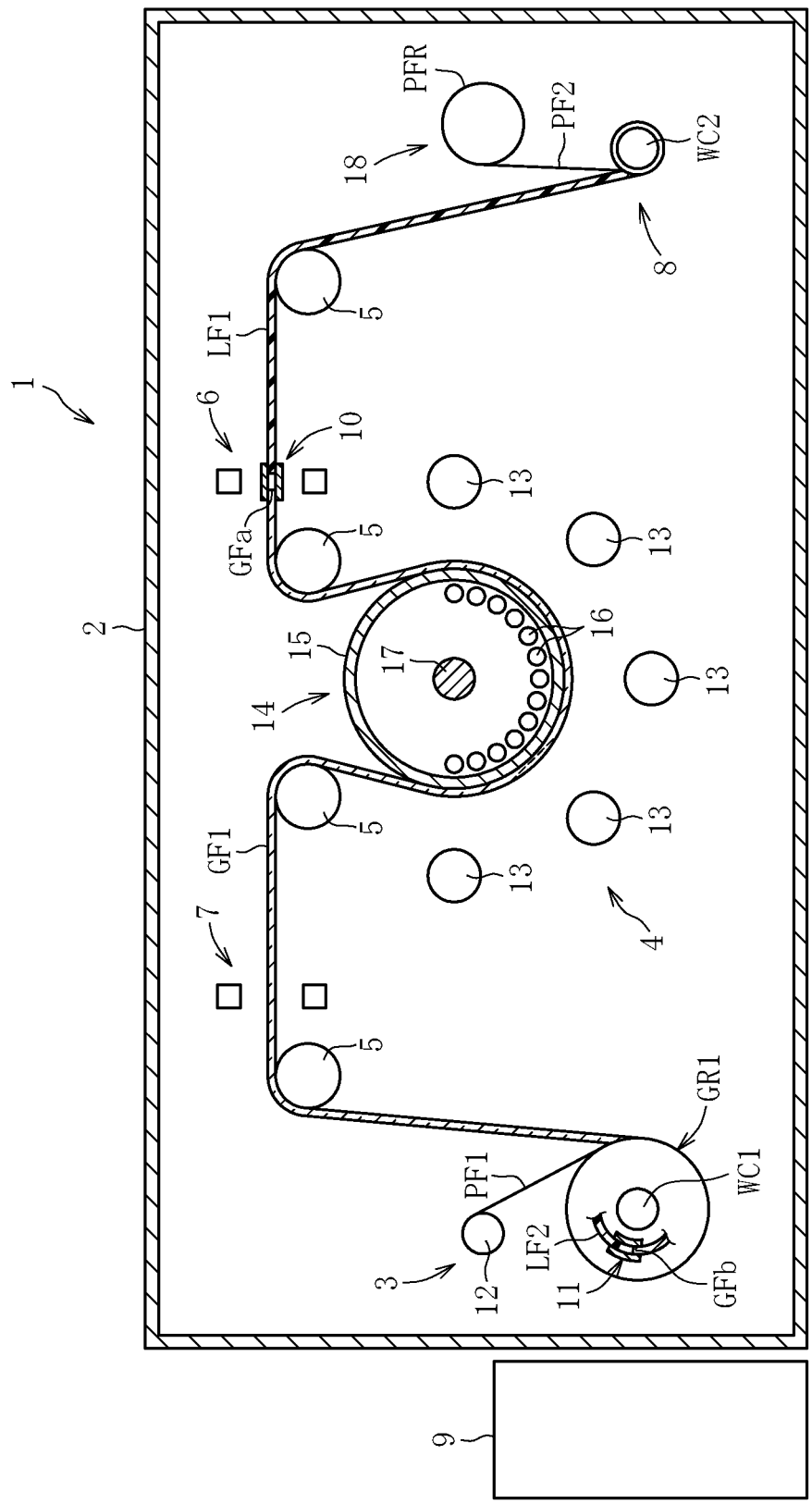
FIG. 3 is a sectional view for illustrating one step of the production method for a glass roll.

The start preparation step S1 comprises a temperature increasing step of causing the film-forming device 4 to be increased in temperature. As illustrated in FIG. 3, when the first coupling portion 10 passes through the film-forming device 4, the first sensor 6 detects the first coupling portion 10 and the starting end portion GFa of the first glass film GF1 and transmits a detection signal to the control device 9. In this way, the control device 9 causes the heaters 16 of the heating unit 14 to operate to start heating the roller main body 15. At the start of the temperature increasing step, the first coupling portion 10 and the starting end portion GFa of the first glass film GF1 has passed through the film-forming device 4. Thus, the first lead film LF1 is prevented from coming into contact with the roller main body 15 during execution of the temperature increasing step.

While guiding the first glass film GF1 to the downstream side, the roller main body 15 is heated by the heaters 16 so that the temperature of the roller main body 15 becomes equal to or higher than a predetermined film-forming temperature. The temperature of the roller main body 15 to be heated is set to, for example, a temperature of equal to or higher than 200° C. and equal to or lower than 500° C., but is not limited to this range. During execution of the temperature increasing step, the sputter sources 13 do not operate, and do not release the sputter particles.

After completion of the temperature increasing step (when the roller main body 15 is heated to a temperature equal to or higher than the predetermined film-forming temperature), the control device 9 starts the film-forming step S2. The control device 9 controls the delivery speed of the unwinding device 3, the rotation speed of the roller main body 15, and the winding speed of the winding device 8 to increase the conveyance speed of the first glass film GF1. It is preferred that the conveyance speed of the first glass film GF1 in the film-forming step S2 be constant within a range of from 0.1 m/min to 10 m/min, but the conveyance speed is not limited to this range.

While heating the first glass film GF1, the roller main body 15 guides the first glass film GF1 to the downstream side. The first glass film GF1 is heated to a temperature of equal to or higher than 150° C. by the roller main body 15. When the sputter particles are ITO particles, it is preferred that the first glass film GF1 be heated to a temperature of equal to or higher than 200° C., more preferably 250° C., most preferably equal to or higher than 300° C.

Through control by the control device 9, the film-forming device 4 causes the sputter particles (for example, ITO particles) to disperse from the plurality of sputter sources 13 so as to allow the sputter particles to sequentially adhere to the first glass film GF1 being conveyed by the roller main body 15.

When the first glass film GF1 is heated by the roller main body 15, the ITO particles adhering to the first glass film GF1 are crystallized so that a functional film FM having a low resistance (for example, equal to or lower than 20 Ω/□) is formed. In this way, the second glass film GF2 is formed as illustrated in FIG. 4.

Figure 4:
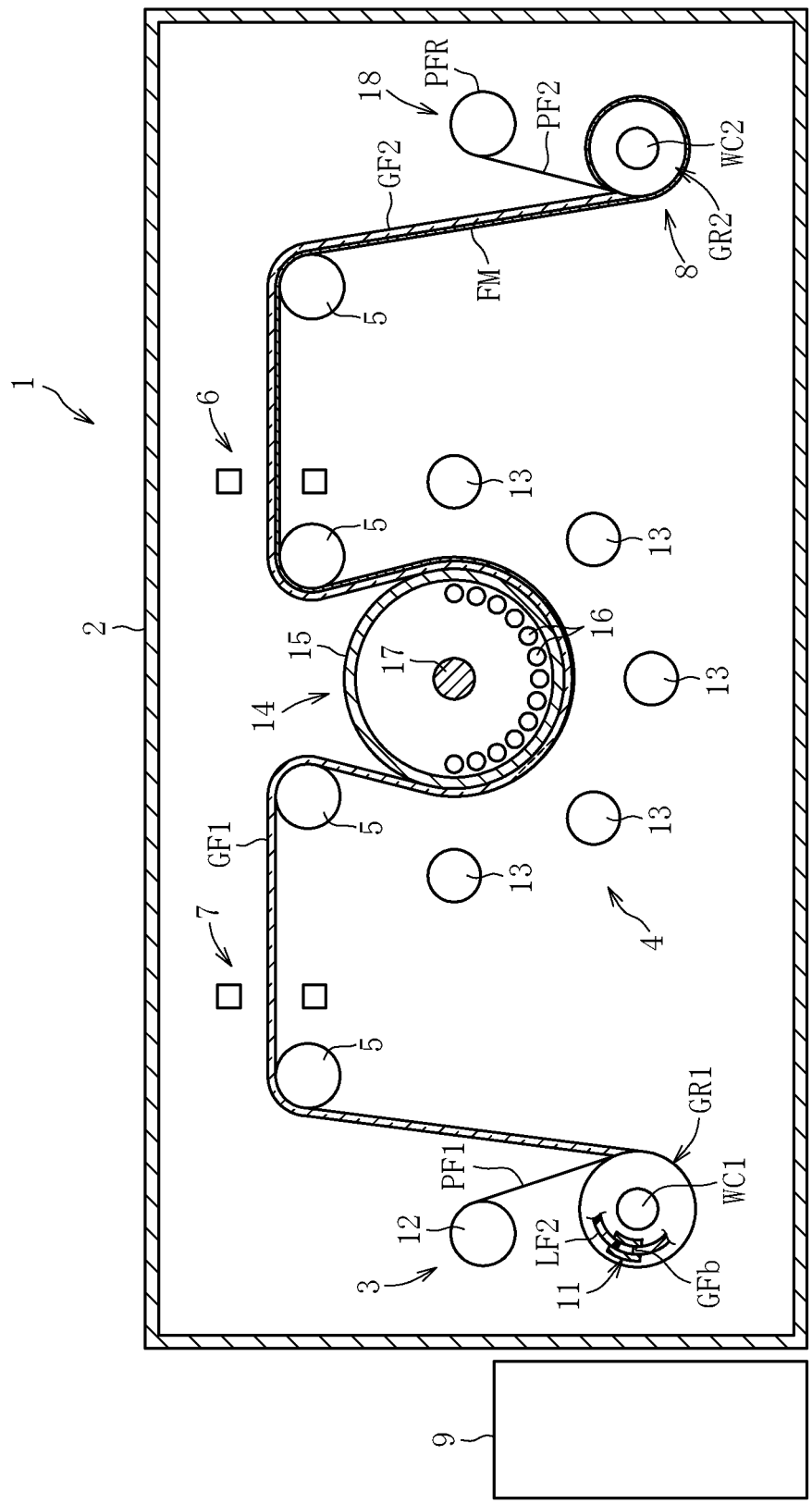
FIG. 4 is a sectional view for illustrating one step of the production method for a glass roll.

As illustrated in FIG. 4, in the film-forming step S2, while the protective film PF2 is superposed on the second glass film GF2 by the protective film supplying portion 18, the second glass film GF2 and the protective film PF2 are wound around the winding core WC2 by the winding device 8. In this way, a glass roll GR2 is formed around the winding core WC2. The glass roll GR2 is increased in outer diameter in accordance with the rotation of the winding core WC2.

Figure 5:
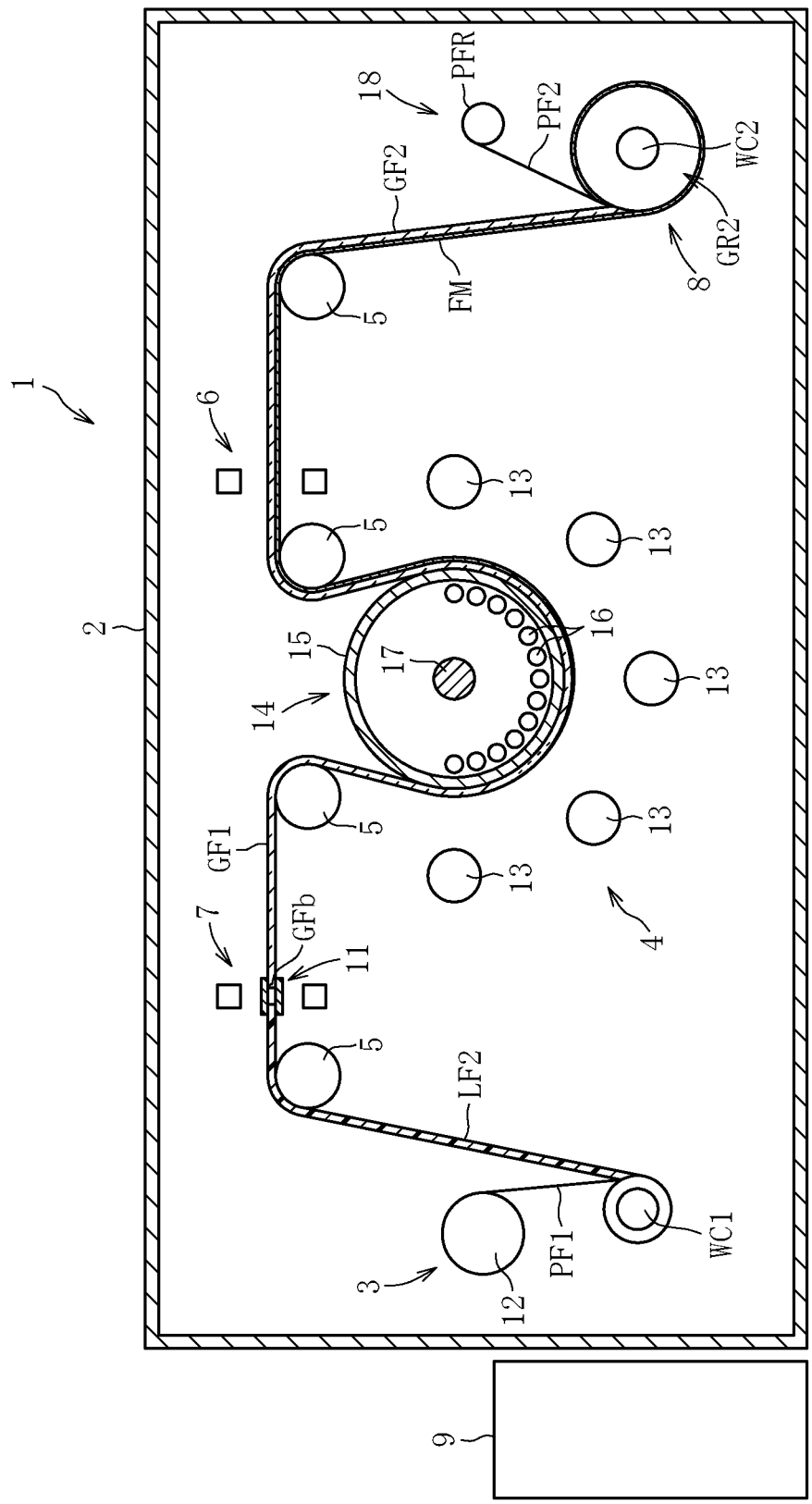
FIG. 5 is a sectional view for illustrating one step of the production method for a glass roll.

When the film-forming step S2 approaches the termination, the first glass film GF1 is entirely fed-out from the unwinding device 3. After that, the second coupling portion 11 is fed-out from the unwinding device 3. As illustrated in FIG. 5, when the second coupling portion 11 reaches the second sensor 7, the second sensor 7 detects the second coupling portion 11 and the terminating end portion GFb of the first glass film GF1 and then transmits a detection signal to the control device 9.

After receiving the signal from the second sensor 7, the control device 9 starts the termination preparation step S3. The termination preparation step S3 comprises a temperature decreasing step of causing the film-forming device 4 to be decreased in temperature in order to prevent breakage of the second lead film LF2. The temperature decreasing step is started while the first glass film GF1 passes through the film-forming device 4 and before the terminating end portion GFb reaches the film-forming device 4.

In the temperature decreasing step, the control device 9 stops the heating by the heating unit 14. When the heaters 16 stop, the temperature of the roller main body 15 is gradually lowered. Further, the control device 9 stops the sputter sources 13 of the film-forming device 4. Still further, the control device 9 controls the delivery speed of the unwinding device 3, the rotation speed of the heating roller, and the winding speed of the winding device 8 to set the conveyance speed of the first glass film GF1 and the second lead film LF2 to be lower than the conveyance speed in the film-forming step S2. It is more preferred that the conveyance speed be set to be lower than the conveyance speed of the first glass film GF1 in the start preparation step S1.

In the temperature decreasing step, while the first glass film GF1 passes through the heating unit 14, the roller main body 15 is decreased in temperature while being rotated so as to reach such a temperature that breakage of the second lead film LF2 is prevented (for example, equal to or lower than 80° C.). When the first glass film GF1 passes through the heating unit 14, the second lead film LF2 coupled to the terminating end portion GFb of the first glass film GF1 reaches the heating unit 14. At this time, the temperature of the roller main body 15 is sufficiently lowered. Thus, the second lead film LF2 is conveyed to the downstream side by the roller main body 15 without breakage.

After the second lead film LF2 having passed through the film-forming device 4 is wound by the winding device 8, the termination preparation step S3 is terminated, and the glass roll GR2 is completed in a state of being supported by the winding device 8. The glass roll GR2 is taken out from the vacuum chamber 2 and is sent to the next step.

In the subsequent steps, the second glass film GF2 is drawn out from the glass roll GR2, and a predetermined circuit pattern (for example, electrode pattern) is formed on the functional film FM by a method such as photolithography. After predetermined processes related to production are executed, the protective film PF2 is removed (separated) from the second glass film GF2.

According to the production method for the glass roll GR2 according to the embodiment described above, in the start preparation step S1, in order to prevent breakage of the first lead film LF1 caused by heat of the heating unit 14, the first glass film GF1 is allowed to reach the heating unit 14 before the roller main body 15 is increased in temperature to the film-forming temperature, that is, before the start of the temperature increasing step. Thus, the roller main body 15 of the heating unit 14 is heated by the heaters 16 while conveying the first glass film GF1 without contact with the first lead film LF1. Accordingly, the film-forming step S2 can reliably be performed without melting the first lead film LF1.

Further, in the termination preparation step S3, when the temperature decreasing step is executed while the first glass film GF1 passes through the film-forming device 4, the second lead film LF2 passes through the film-forming device 4 without breakage caused by the heat of the heating unit 14 and is wound by the winding device 8.

In this embodiment, when the conveyance speed of the first glass film GF1 in the start preparation step S1 and the termination preparation step S3 is set to be lower than the conveyance speed of the first glass film GF1 in the film-forming step S2, the amount (length) of the first glass film GF1 which passes through the film-forming device 4 without being subjected to film formation during execution of the temperature increasing step and during execution of the temperature decreasing step can be reduced as much as possible.

Further, when the conveyance speed of the first glass film GF1 in the termination preparation step S3 is set to be lower than the conveyance speed of the first glass film GF1 in the start preparation step S1, the amount (length) of the first glass film GF1 which passes through the film-forming device 4 without being subjected to film formation in the temperature decreasing step that requires a longer time than the temperature increasing step can be reduced as much as possible.

Figure 6:
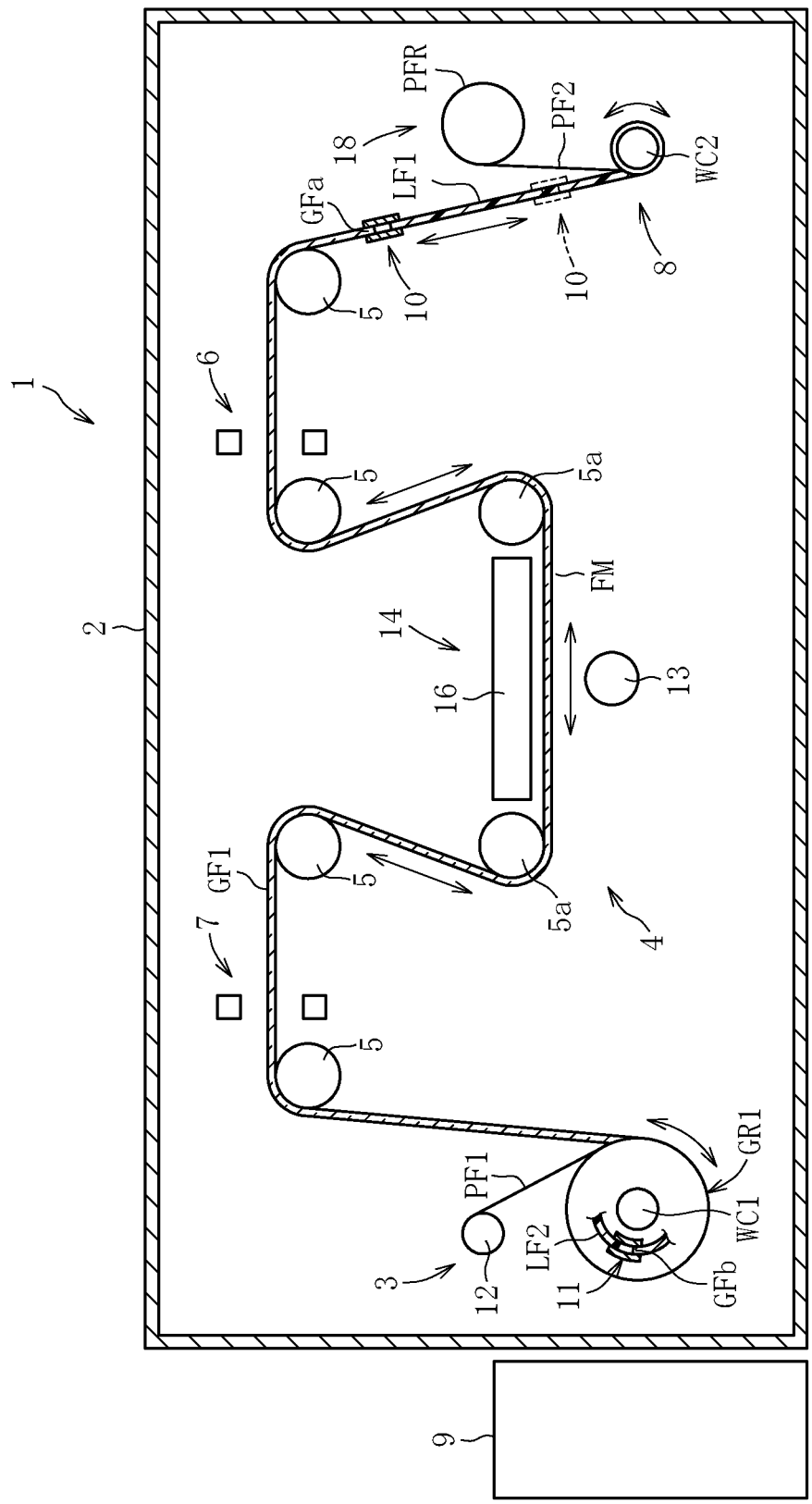
FIG. 6 is a sectional view for illustrating one step of a production method for a glass roll according to a second embodiment.
Figure 7:
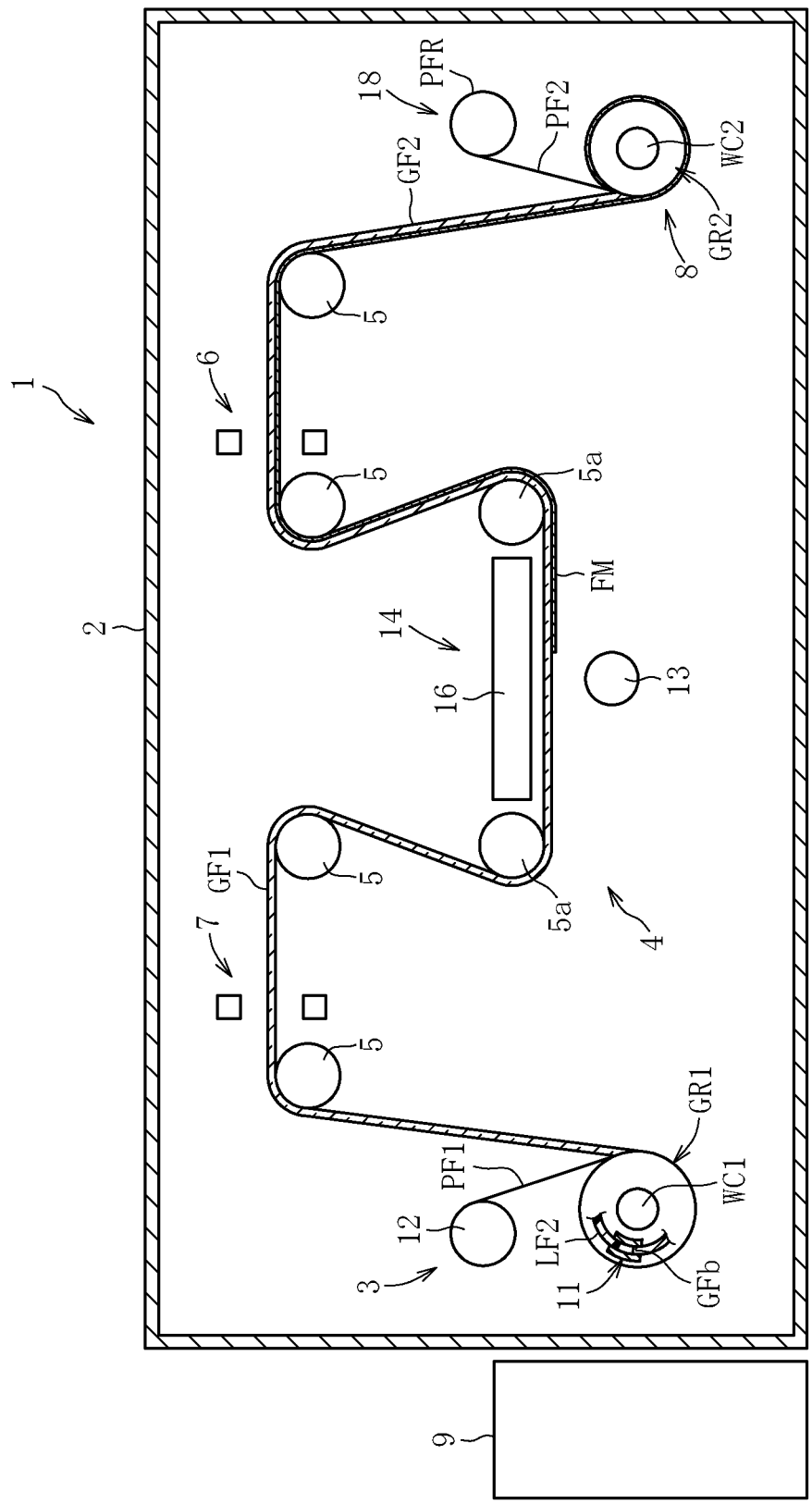
FIG. 7 is a sectional view for illustrating one step of the production method for a glass roll.

FIG. 6 and FIG. 7 show a second embodiment of the present invention. In this embodiment, a configuration of the film-forming device 4 in the production apparatus 1 is different from that of the first embodiment. The heating unit 14 of this embodiment does not comprise the roller main body 15, and comprises a heater 16 configured to heat the first glass film GF1 without contact with the first glass film GF1. The sputter source 13 and the heater 16 are arranged apart from each other by a predetermined distance. At positions in the vicinity of the heater 16, there are arranged guide rollers 5a configured to guide the first lead film LF1, the first glass film GF1, and the second lead film LF2 between the sputter source 13 and the heater 16.

Other configurations in this embodiment are the same as those in the first embodiment. In this embodiment, the components common to the first embodiment are denoted by the same reference symbols as those in the first embodiment.

Now, description is made of a method of producing the glass roll GR2 with use of the production apparatus 1 having the configuration described above. In this embodiment, in the start preparation step S1, after the first glass film GF1 reaches the film-forming device 4 (heating unit 14), as in the first embodiment, the first coupling portion 10 and the starting end portion GFa of the first glass film GF1 are detected by the first sensor 6, and the temperature increasing step is started.

As illustrated in FIG. 6, during execution of the temperature increasing step, the control device 9 controls the unwinding device 3, the guide rollers 5 and 5a, and the winding device 8 to reciprocally move the first lead film LF1 and the first glass film GF1 on a conveyance path between the unwinding device 3 and the winding device 8. In this case, it is preferred that the first coupling portion 10 and the starting end portion GFa of the first glass film GF1 reciprocally move in a region on the downstream side of the first sensor 6. In this way, it is possible to allow the first glass film GF1 to stay on the conveyance path without breakage of the first lead film LF1 and without causing the first coupling portion 10 and the starting end portion GFa of the first glass film GF1 to be detected by the first sensor 6 again. With this reciprocal movement, the amount of the first glass film GF1 to be wound by the winding device 8 without formation of the functional film FM can be reduced as much as possible. The mode of the reciprocal movement is applicable also to the production method for a glass roll according to the first embodiment of the present invention, which is illustrated in FIG. 1 to FIG. 5.

After completion of the temperature increasing step, the control device 9 controls the unwinding device 3, the guide rollers 5 and 5a, and the winding device 8 to terminate the reciprocal movement of the first glass film GF1 and convey the first glass film GF1 toward the winding device 8 on the downstream side. After that, as illustrated in FIG. 7, the film-forming step S2 by the film-forming device 4 is executed. After termination of the film-forming step S2, as in the first embodiment, the control device 9 executes the termination preparation step S3.

The present invention is not limited to the configurations of the above-mentioned embodiments. In addition, the action and effect of the present invention are not limited to those described above. The present invention may be modified in various forms within the range not departing from the spirit of the present invention.

In the embodiments described above, illustration is given of the example in which the glass films GF1 and GF2 and the lead films LF1 and LF2 are conveyed while the conveyance speed of the glass films GF1 and GF2 and the lead films LF1 and LF2 in the start preparation step S1 and the termination preparation step S3 is set to be lower than the conveyance speed of the glass films GF1 and GF2 in the film-forming step S2. However, the present invention is not limited to this configuration. For example, in the start preparation step S1 and the termination preparation step S3, the conveyance of the glass films GF1 and GF2 and the lead films LF1 and LF2 may be temporarily stopped. However, when there is a risk in that the roller main body 15 and the glass films GF1 and GF2 scratch each other due to thermal expansion and contraction of the roller main body 15 of the heating unit 14, it is preferred that the first glass film GF1 be conveyed at low speed without stopping.

Further, the conveyance speed of the first glass film GF1 in the start preparation step S1 and the conveyance speed of the first glass film GF1 in the termination preparation step S3 maybe set to be equal to each other. Further, the conveyance speed of the first glass film GF1 in the start preparation step S1 and the termination preparation step S3 and the conveyance speed of the first glass film GF1 in the film-forming step S2 may be set to be equal to each other.

In the embodiments described above, illustration is given of the example in which the temperature increasing step of the start preparation step S1 is started after the first coupling portion 10 and the starting end portion GFa of the first glass film GF1 passes through the heating unit 14. However, the present invention is not limited to this configuration. For example, the temperature increasing step may be started while the first lead film LF1 is conveyed by the roller main body 15 of the heating unit 14. That is, in the present invention, it is only required that the first glass film GF1 reach the heating unit 14 during execution of the temperature increasing step (before the roller main body 15 is increased in temperature to the film-forming temperature).

In the embodiments described above, illustration is given of the example in which the heater 16 of the heating unit 14 is stopped in the temperature decreasing step of the termination preparation step S3 so that the heating unit 14 is naturally cooled in the vacuum chamber 2. However, the present invention is not limited to this mode. For example, in the temperature decreasing step, the heating unit 14 may be cooled by spraying a coolant such as an inactive gas from a nozzle arranged in the vacuum chamber 2 to the heating unit 14.

In the embodiments described above, in the start preparation step S1, the conveyance speed of the first lead film is set to a relatively low speed (for example, 0.01 m/min to 0.5 m/min). However, the present invention is not limited to this mode. For example, when the position of the first sensor 6 is suitably adjusted, or the number of sensors is increased, to thereby set the conveyance speed in the start preparation step S1 to a speed (for example, 1 m/min to 15 m/min) which is higher than the conveyance speed in the film-forming step S2 (for example, 0.1 m/min to 10 m/min) before the sensor detects the first coupling portion 10, the lead time up to the start of the temperature increasing step can be shortened. In this case, after the sensor detects the first coupling portion 10, the conveyance speed may be set to a relatively low speed (for example, 0.01 m/min to 0.5 m/min), and the temperature increasing step may be started.

In the embodiments described above, description is made with the embodiments in which, in the termination preparation step S3, the conveyance speed of the first glass film GF1 is set to be lower than the conveyance speed of the first glass film GF1 in the start preparation step S1. However, the present invention is not limited to those embodiments. For example, in the termination preparation step S3, when the temperature of the film-forming device 4 is sufficiently lowered after termination of the temperature decreasing step, in order to shorten the lead time, the conveyance speed of the second lead film LF2 may be set to a high speed (for example, 1 m/min to 15 m/min).

REFERENCE SIGNS LIST 3 unwinding device
4 film-forming device
8 winding device
14 heating unit (heating roller)
FM functional film
GF1 first glass film
GF2 second glass film
GFa starting end portion of first glass film
GFb terminating end portion of first glass film
LF1 first lead film
LF2 second lead film
GR2 glass roll
S1 start preparation step
S2 film-forming step
S3 termination preparation step

The invention claimed is:

1. A production method for a glass roll, in which a functional film is formed with a thermal film-forming device on a first glass film fed-out from an unwinding device to form a second glass film and the second glass film is wound by a winding device, the production method comprising:
    a start preparation step of feeding-out a first lead film coupled to a starting end portion of the first glass film from the unwinding device and allowing the winding device to wind the first lead film after passing of the first lead film through the thermal film-forming device; and
    a film-forming step of forming a functional film on the first glass film with the thermal film-forming device after the passing of the first lead film through the thermal film-forming device,
    wherein the start preparation step comprises a temperature increasing step of causing the thermal film-forming device to be increased in temperature to a film-forming temperature, and
    wherein, before the thermal film-forming device is increased in temperature to the film-forming temperature, the first glass film reaches the thermal film-forming device.

2. The production method for a glass roll according to claim 1, wherein the temperature increasing step is started after a coupling portion between the first glass film and the first lead film passes through the thermal film-forming device.

3. The production method for a glass roll according to claim 2, further comprising a termination preparation step of feeding-out a second lead film coupled to a terminating end portion of the first glass film from the unwinding device and allowing the winding device to wind the second lead film, after passing of the second lead film through the thermal film-forming device,
    wherein the termination preparation step comprises a temperature decreasing step of causing the thermal film-forming device to be decreased in temperature, and
    wherein the temperature decreasing step is started before the terminating end portion of the first glass film reaches the thermal film-forming device.

4. The production method for a glass roll according to claim 3,
    wherein the thermal film-forming device comprises a heating roller configured to convey the first glass film while heating the first glass film in contact, and
    wherein a conveyance speed of the first glass film in the start preparation step is set to be lower than a conveyance speed of the first glass film in the film-forming step.

5. The production method for a glass roll according to claim 2,
    wherein the thermal film-forming device comprises a heating roller configured to convey the first glass film while heating the first glass film in contact, and
    wherein a conveyance speed of the first glass film in the start preparation step is set to be lower than a conveyance speed of the first glass film in the film-forming step.

6. The production method for a glass roll according to claim 2, wherein, in the temperature increasing step, the first glass film is caused to reciprocally move between the unwinding device and the winding device after the first glass film reaches the thermal film-forming device.

7. The production method for a glass roll according to claim 1, wherein, while the thermal film-forming device is increased in temperature in the temperature increasing step, the first glass film reaches the thermal film-forming device.

8. The production method for a glass roll according to claim 7, further comprising a termination preparation step of feeding-out a second lead film coupled to a terminating end portion of the first glass film from the unwinding device and allowing the winding device to wind the second lead film, after passing of the second lead film through the thermal film-forming device,
    wherein the termination preparation step comprises a temperature decreasing step of causing the thermal film-forming device to be decreased in temperature, and
    wherein the temperature decreasing step is started before the terminating end portion of the first glass film reaches the thermal film-forming device.

9. The production method for a glass roll according to claim 7,
wherein the thermal film-forming device comprises a heating roller configured to convey the first glass film while heating the first glass film in contact, and
wherein a conveyance speed of the first glass film in the start preparation step is set to be lower than a conveyance speed of the first glass film in the film-forming step.

10. The production method for a glass roll according to claim 7, wherein, in the temperature increasing step, the first glass film is caused to reciprocally move between the unwinding device and the winding device after the first glass film reaches the thermal film-forming device.

11. The production method for a glass roll according to claim 1, further comprising a termination preparation step of feeding-out a second lead film coupled to a terminating end portion of the first glass film from the unwinding device and allowing the winding device to wind the second lead film, after passing of the second lead film through the thermal film-forming device,
wherein the termination preparation step comprises a temperature decreasing step of causing the thermal film-forming device to be decreased in temperature, and
wherein the temperature decreasing step is started before the terminating end portion of the first glass film reaches the thermal film-forming device.

12. The production method for a glass roll according to claim 11,
wherein the thermal film-forming device comprises a heating roller configured to convey the first glass film while heating the first glass film in contact, and
wherein a conveyance speed of the first glass film in the termination preparation step is set to be lower than a conveyance speed of the first glass film in the film-forming step.

13. The production method for a glass roll according to claim 12, wherein, in the temperature increasing step, the first glass film is caused to reciprocally move between the unwinding device and the winding device after the first glass film reaches the thermal film-forming device.

14. The production method for a glass roll according to claim 11,
wherein the thermal film-forming device comprises a heating roller configured to convey the first glass film while heating the first glass film in contact, and
wherein a conveyance speed of the first glass film in the termination preparation step is set to be lower than a conveyance speed of the first glass film in the start preparation step.

15. The production method for a glass roll according to claim 14, wherein, in the temperature increasing step, the first glass film is caused to reciprocally move between the unwinding device and the winding device after the first glass film reaches the thermal film-forming device.

16. The production method for a glass roll according to claim 11,
wherein the thermal film-forming device comprises a heating roller configured to convey the first glass film while heating the first glass film in contact, and
wherein a conveyance speed of the first glass film in the start preparation step is set to be lower than a conveyance speed of the first glass film in the film-forming step.

17. The production method for a glass roll according to claim 11, wherein, in the temperature increasing step, the first glass film is caused to reciprocally move between the unwinding device and the winding device after the first glass film reaches the thermal film-forming device.

18. The production method for a glass roll according to claim 1,
wherein the thermal film-forming device comprises a heating roller configured to convey the first glass film while heating the first glass film in contact, and
wherein a conveyance speed of the first glass film in the start preparation step is set to be lower than a conveyance speed of the first glass film in the film-forming step.

19. The production method for a glass roll according to claim 18, wherein, in the temperature increasing step, the first glass film is caused to reciprocally move between the unwinding device and the winding device after the first glass film reaches the thermal film-forming device.

20. The production method for a glass roll according to claim 1, wherein, in the temperature increasing step, the first glass film is caused to reciprocally move between the unwinding device and the winding device after the first glass film reaches the thermal film-forming device.

* * * * *